United States Patent
Hekmat et al.

(10) Patent No.: US 9,674,008 B2
(45) Date of Patent: Jun. 6, 2017

(54) BODY-BIASED SLICER DESIGN FOR PREDICTIVE DECISION FEEDBACK EQUALIZERS

(71) Applicant: SAMSUNG DISPLAY CO., LTD., Yongin, Gyeonggi-Do (KR)

(72) Inventors: Mohammad Hekmat, Mountain View, CA (US); Amir Amirkhany, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 68 days.

(21) Appl. No.: 14/340,463

(22) Filed: Jul. 24, 2014

(65) Prior Publication Data
US 2015/0116299 A1  Apr. 30, 2015

Related U.S. Application Data

(60) Provisional application No. 61/898,421, filed on Oct. 31, 2013.

(51) Int. Cl.
*H04L 25/03* (2006.01)
*H03M 1/70* (2006.01)
(Continued)

(52) U.S. Cl.
CPC ....... *H04L 25/03057* (2013.01); *G09G 5/006* (2013.01); *H03M 1/002* (2013.01);
(Continued)

(58) Field of Classification Search
CPC ......... H04L 25/03019; H04L 25/03057; H04L 25/03146; H04L 25/03878; H03M 1/002; H03M 1/70
See application file for complete search history.

(56) References Cited

U.S. PATENT DOCUMENTS 5,132,562 A * 7/1992 Chan .................. H03K 19/0136
                                                    326/126
7,499,489 B1 * 3/2009 Ellersick et al. ............. 375/229
(Continued)

FOREIGN PATENT DOCUMENTS

KR   2000-0025739 A    5/2000
KR   10-0474821 B1     2/2005

OTHER PUBLICATIONS

EPO Search Report dated Mar. 16, 2015, for corresponding European Patent application 14189173.9, (7 pages).
(Continued)

*Primary Examiner* — David B. Lugo
(74) *Attorney, Agent, or Firm* — Lewis Roca Rothgerber Christie LLP

(57) ABSTRACT

A predictive decision feedback equalizer using body bias of one or more field effect transistors (FETs) to provide an offset for a predictive tap. In one embodiment, a predictive tap of the predictive decision feedback equalizer includes a differential amplifier composed of two FETs in a differential amplifier configuration, and the body bias of one or both FETs is controlled to provide an offset in the differential amplifier. In one embodiment a current DAC driving a DAC resistor is used to provide the body bias voltage, and a feedback circuit, including a replica circuit forming the maximum possible DAC output voltage, is used to control the bias of the current sources of the current DAC.

21 Claims, 9 Drawing Sheets

(51) Int. Cl.
*H03M 1/00* (2006.01)
*G09G 5/00* (2006.01)

(52) U.S. Cl.
CPC ........ *H03M 1/70* (2013.01); *H04L 25/03146* (2013.01); *H04L 25/03878* (2013.01); *G09G 2310/0297* (2013.01); *G09G 2330/021* (2013.01)

(56) References Cited

U.S. PATENT DOCUMENTS

| | | |
|---|---|---|
| 7,792,187 B2 | 9/2010 | Bulzacchelli et al. |
| 2008/0063042 A1 | 3/2008 | Tsuie et al. |
| 2008/0309390 A1* | 12/2008 | Sahu ............... H03M 1/004 327/170 |
| 2012/0121004 A1* | 5/2012 | Chang .................... 375/232 |
| 2013/0208782 A1* | 8/2013 | Agrawal et al. ......... 375/233 |
| 2015/0085957 A1* | 3/2015 | Jing et al. ............... 375/319 |

OTHER PUBLICATIONS

Zhang, Xuelin, et al, "A 6.25-Gbps 4-tap Low-Power Decision Feedback Equalizer in 0.13μm CMOS Technology", 2013 IEEE International Conference of Electron Devices and Solid-State Circuits, IEEE, Jun. 3, 2013, pp. 1-2, XP32502613.

Hsieh, Chang-Lin, et al, "Decision Feedback Equalizers Using the Back-Gate Feedback Technique", IEEE Transactions on Circuits and Systems 11: Express Briefs, IEEE, vol. 58, No. 12, Dec. 12, 2011, pp. 897-901, XP11388899.

Turker, Didem Z, et al, "A 19Gb/s 38mW 1-Tap Speculative DFE Receiver in 90nm CMOS", 2009 Symposium on VLSI Circuits Digest of Technical Papers, IEEE, Piscataway, NJ, Jun. 16, 2009, pp. 216-217, XP31513099.

\* cited by examiner

BODY-BIASED SLICER DESIGN FOR PREDICTIVE DECISION FEEDBACK EQUALIZERS

CROSS-REFERENCE TO RELATED APPLICATIONS

The present application claims priority to and the benefit of Provisional Application No. 61/898,421, filed Oct. 31, 2013, entitled "BODY-BIASED SLICER DESIGN FOR PREDICTIVE DECISION FEEDBACK EQUALIZERS", the entire content of which is hereby incorporated by reference.

FIELD

The following description relates to transmission of digital data over a non-ideal (e.g., lossy) channel, and more particularly to a predictive decision feedback equalizer for mitigating inter-symbol interference resulting from transmission through a non-ideal channel.

BACKGROUND

High-speed digital data links may suffer from inter-symbol interference, especially in situations in which loss, reflections or other imperfections exist in the transmission channel. Inter-symbol interference may have the effect that the signal received during a given clock cycle is a linear combination of the bit transmitted during the corresponding clock cycle at the transmitter, and of the bits transmitted during a number of preceding clock cycles. The effects of inter-symbol interference may be mitigated using a technique referred to as decision feedback equalization (DFE) which involves correcting the received signal at the sampling point, during each clock cycle, with a linear combination of the bits received during a number of preceding clock cycles.

The contribution from the immediately preceding received bit, which is referred to as the first tap, may be generated using a technique referred to as predictive decision feedback equalization (predictive DFE, which may also be referred to as speculative DFE or loop-unrolled DFE), in which two correction terms are calculated, one corresponding to a received 1, and one corresponding to a received 0 in the immediately preceding received bit; the appropriate one of these two correction terms is then selected using a multiplexer (MUX) once a binary value for the bit received on the immediately preceding clock cycle is available.

In particular, a current digital to analog converter (DAC) may be used to add a current to the output current of a comparator, which may be implemented as a differential pair, within a clocked comparator used to sample the received signal. The current added to the output effectively implements the preceding bit with the right scaling factor. This approach has several disadvantages. A DAC consumes power and, because it represents a capacitive load, it limits the speed of the circuit.

Thus, there is a need for a system for predictive feedback equalization that achieves improved speed, with acceptable power consumption.

SUMMARY

In a predictive decision feedback equalizer, body bias of one or more field effect transistors (FETs) is used to provide an offset for a predictive tap. In one embodiment, a predictive tap of the predictive decision feedback equalizer includes a differential amplifier composed of two FETs in a differential amplifier configuration, and the body bias of one or both FETs is controlled to provide an offset in the differential amplifier. In one embodiment a current DAC driving a DAC resistor is used to provide the body bias voltage, and a feedback circuit, including a replica circuit forming the maximum possible DAC output voltage, is used to control the bias of the current sources of the current DAC.

According to an embodiment of the present invention there is provided a receiver with predictive decision feedback equalization, the receiver including: a first differential amplifier including a first field effect transistor (FET) and a second FET, the first FET and the second FET being connected in a differential pair configuration; and a voltage-mode digital to analog converter (DAC) including a first DAC output, the first DAC output being connected to a bulk terminal of the first FET; and a DAC voltage limit circuit connected to the DAC.

In one embodiment, the DAC includes a DAC resistor, a plurality of branches, and a bias control input; and the DAC voltage limit circuit includes a reference voltage input connected to a common node of the first differential amplifier, and a replica circuit having a replica voltage output, the replica circuit including a scaled replica of a branch of the plurality of branches of the DAC.

In one embodiment, each of the plurality of branches of the DAC includes a branch current source.

In one embodiment, the branch current source of a first branch of the DAC includes a FET having a first gate width, the gate of the FET connected to the bias control input of the DAC, and the branch current sources of a remainder of the branches of the plurality of branches of the DAC include FETs having gate widths of increasing powers of 2 times the first gate width.

In one embodiment, the replica circuit includes a current source replica FET, a switching transistor replica FET, and a replica resistor, connected in series.

In one embodiment, each of the branch current sources of the plurality of branches of the DAC includes a FET, each FET having a gate width; the resistance of the replica resistor is k times the resistance of the DAC resistor, where k is a replica scaling factor; and the gate width of the current source replica FET is the sum of the gate widths of the gate widths of the branch current sources of the plurality of branches of the DAC.

In one embodiment, the bias circuit includes a feedback amplifier having a first input and a second input, the first input being connected to the replica voltage output and the second input being connected to the reference voltage input.

In one embodiment, the feedback amplifier is configured to maintain a voltage at the first input that is substantially the same as that at the second input.

In one embodiment, the feedback amplifier includes an output, and the output is connected to the gate of a first bias control FET, the first bias control FET being connected in series with a second bias control FET, the second bias control FET being diode-connected.

In one embodiment, the second bias control FET is configured to operate as a reference device in a current mirror, the current source replica FET and the FETs of the branch current sources of the DAC being mirror devices in the current mirror.

In one embodiment, the first FET and the second FET of the first differential amplifier are n-channel FETs; the source of the first FET is connected to the common node of the first differential amplifier; and the source of the second FET is connected to the common node of the first differential amplifier.

In one embodiment, the receiver includes the first DAC output and a second DAC output, the second DAC output being connected to a bulk terminal of the second FET.

In one embodiment, each of the plurality of branches of the DAC includes a branch current source.

In one embodiment, the branch current source of a first branch of the DAC includes a FET having a first gate width, the gate of the FET connected to the bias control input of the DAC, and the branch current sources of a remainder of the branches of the plurality of branches of the DAC include FETs having gate widths of increasing powers of 2 times the first gate width.

In one embodiment, the replica circuit includes a current source replica FET, a switching transistor replica FET, and a replica resistor, connected in series.

In one embodiment, each of the branch current sources of the plurality of branches of the DAC includes a FET, each FET having a gate width; the resistance of the replica resistor is k times the resistance of the DAC resistor, where k is a replica scaling factor; and the gate width of the current source replica FET is the sum of the gate widths of the gate widths of the branch current sources of the plurality of branches of the DAC.

In one embodiment, the bias circuit includes a feedback amplifier having a first input and a second input, the first input being connected to the replica voltage output and the second input being connected to the reference voltage input.

In one embodiment, the feedback amplifier includes an amplifier output, and the amplifier output is connected to the gate of a first bias control FET, the first bias control FET being connected in series with a second bias control FET, the second bias control FET being diode-connected.

In one embodiment, the receiver includes a second differential amplifier including a first FET and a second FET, the first FET and the second FET being connected in a differential pair configuration.

In one embodiment, the first DAC output is connected to a bulk terminal of the second FET of the second differential amplifier and the second DAC output is connected to a bulk terminal of the first FET of the second differential amplifier.

In one embodiment, the receiver includes: a timing controller including a digital output; and a driver integrated circuit (IC) including: an IC input; and a receiver input, of a receiver, connected to the IC input, the digital output of the timing controller being connected to the IC input of the driver IC.

BRIEF DESCRIPTION OF THE DRAWINGS

These and other features and advantages of the present invention will be appreciated and understood with reference to the specification, claims and appended drawings wherein:

DETAILED DESCRIPTION

The detailed description set forth below in connection with the appended drawings is intended as a description of exemplary embodiments of a body-biased slicer design for predictive decision feedback equalizers provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
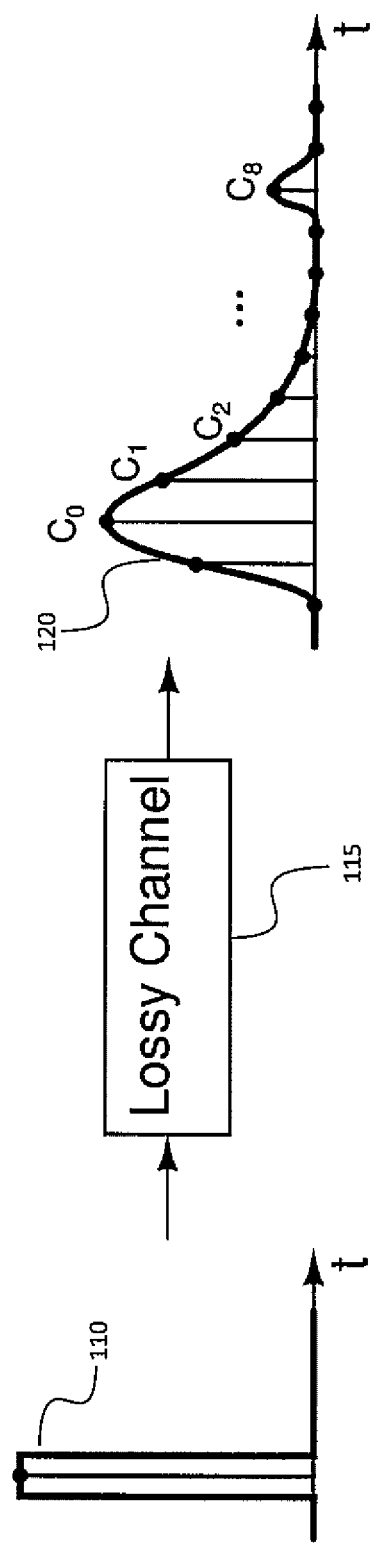
FIG. 1A is an illustration of an input signal to a non-ideal (e.g., lossy) channel and an output signal from the non-ideal channel, exhibiting the effects of inter-symbol interference.

Referring to FIG. 1A, in one embodiment a signal transmitted by a transmitter is a single square pulse 110, which, after being transmitted through a non-ideal (e.g., lossy) channel 115 becomes a received signal 120, having a different shape from the transmitted signal. The received signal 120 has a value C0 at the principal sampling time, i.e., at the sampling time corresponding to the time at which the data is sampled in the receiver, and, because of the imperfect characteristics of the non-ideal channel, the effect of the transmitted pulse 110 persists for several sampling intervals, taking residual signal values referred to as residues C1, C2, and so on. The residual signal causes inter-symbol interference because it is received at the same time as, and superimposed on, the signal corresponding to subsequently transmitted data pulses.

Figure 1B:
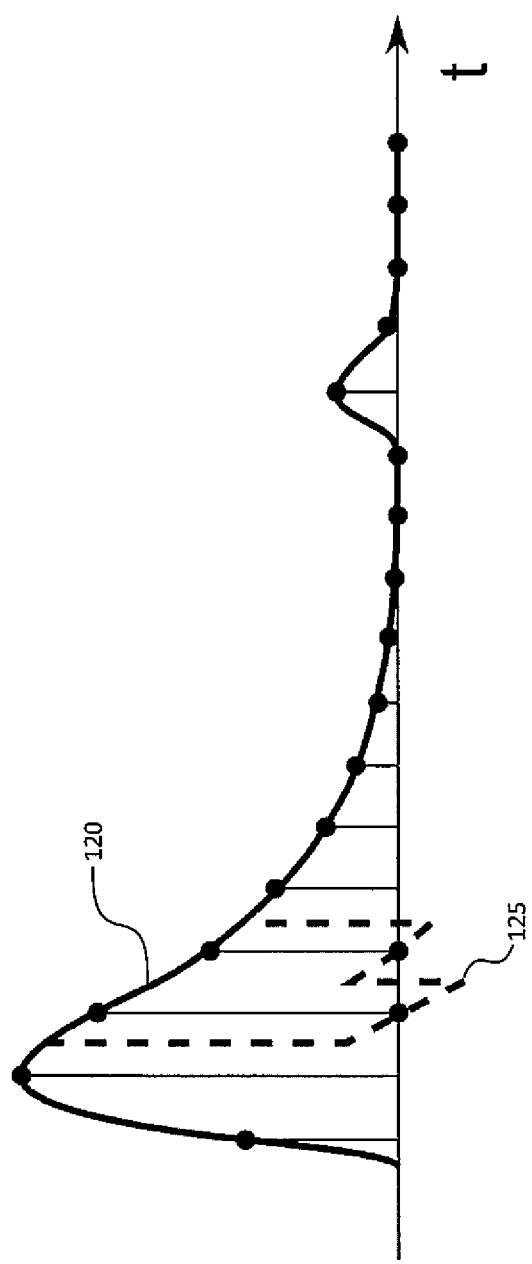
FIG. 1B is a graph showing a signal exhibiting the effects of inter-symbol interference, and a signal in which the effects of inter-symbol interference have been mitigated by feedback equalization according to an embodiment of the present invention.

Referring to FIG. 1B, decision feedback equalization may be used after a decision is made in the receiver regarding whether the transmitted pulse was a 0 or a 1. Once this decision has been made, the shape of the transmitted pulse is inferred, the residues at various sampling time delays are calculated, and the calculated residues are subtracted from the subsequently received signal 120, to reduce the effects of inter-symbol interference in a corrected signal 125.

Figure 2:
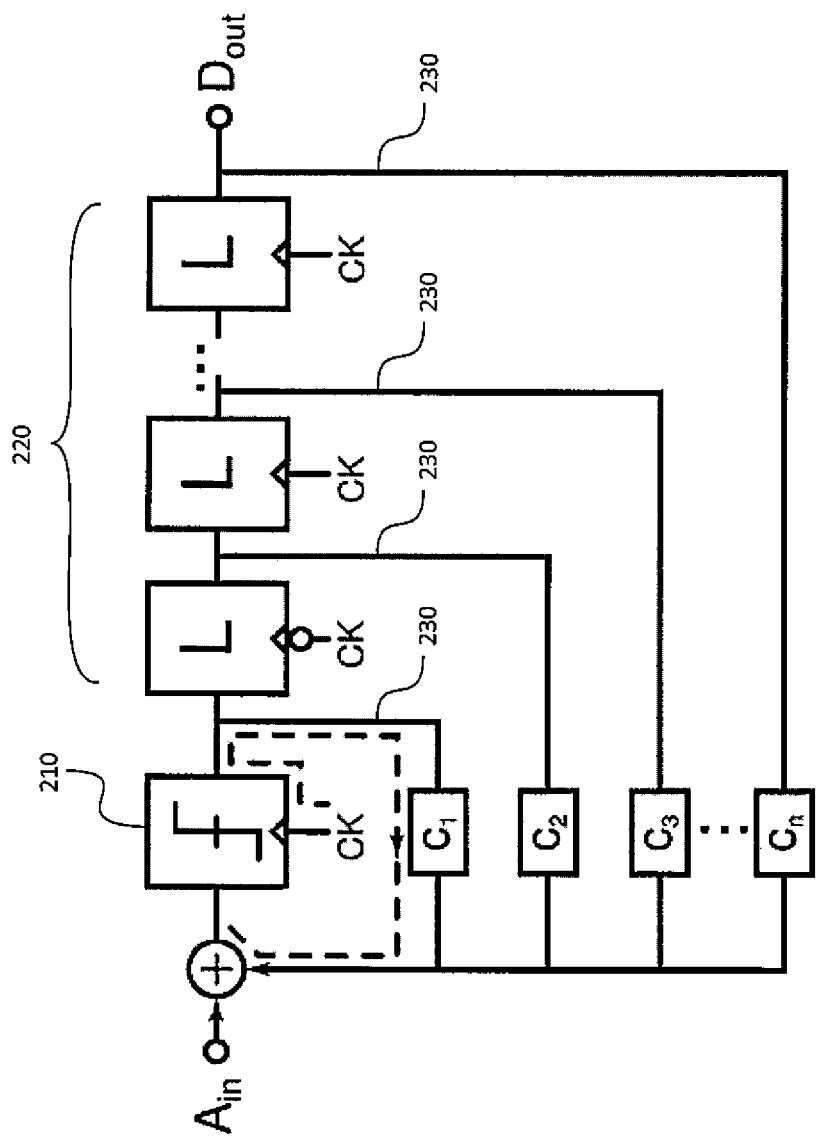
FIG. 2 is a schematic diagram of a system for direct decision feedback equalization.

Referring to FIG. 2, in a related art embodiment, direct DFE is accomplished by processing the received signal with a clocked comparator 210 followed by a shift register 220. Each successive tap 230, including the output of the clocked comparator and the taps of the shift register, contains the bit received at a previous sampling time. Each tap 230 is multiplied by a constant, corresponding to the residue, and fed back and added to the received signal, to cancel the residues from the previously received bits. The path from the first tap is referred to as the critical path because timing along this path presents the greatest challenge in the operation of a direct DFE circuit: in this path the previous bit is resolved and multiplied by its tap value ($C_1$) and subtracted from the current input in one unit interval (UI).

Figure 3:
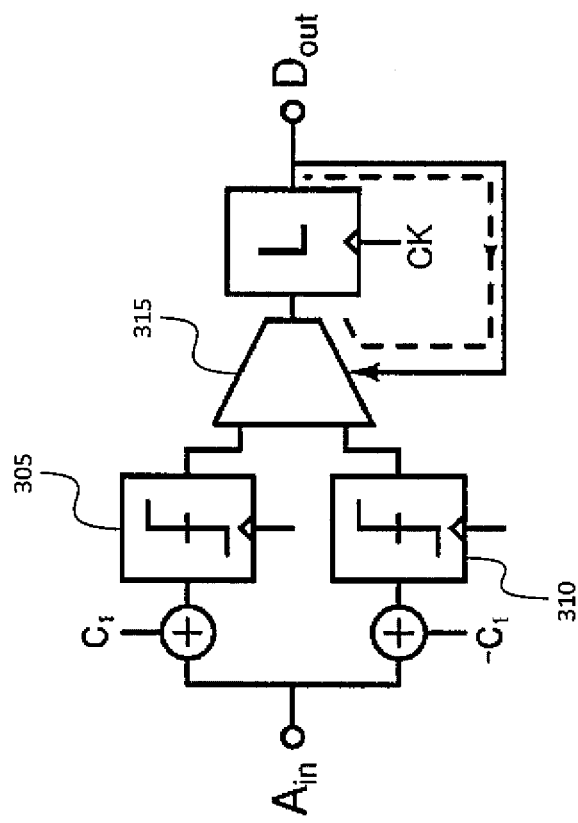
FIG. 3 is a schematic diagram of a system for predictive decision feedback equalization according to an embodiment of the present invention.
Figure 4:
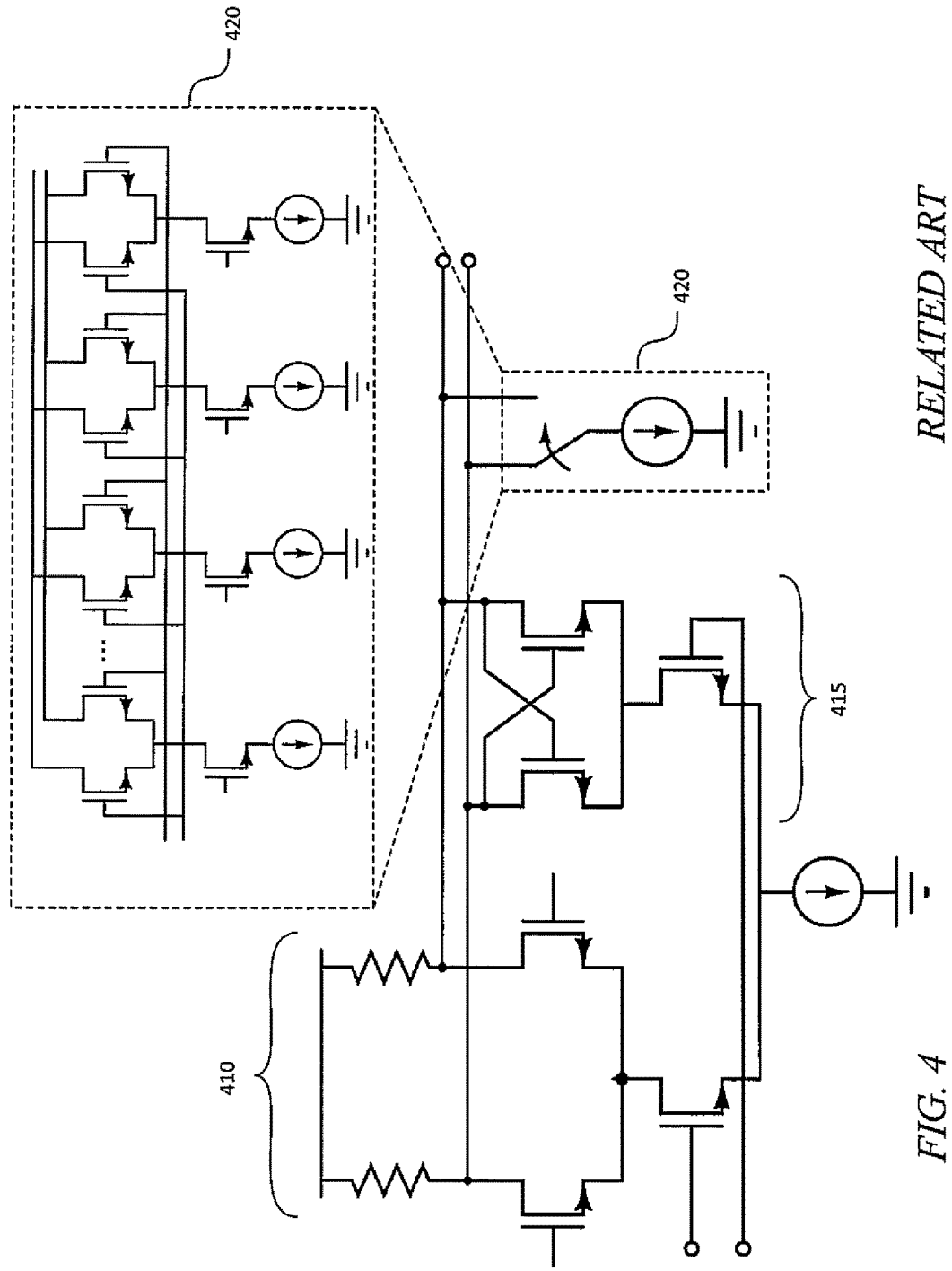
FIG. 4 is a schematic diagram of a system for predictive decision feedback equalization using a current digital to analog converter (DAC) at the output of a slicer.

Referring to FIG. 3, in a predictive DFE according to one related art embodiment, the two possible outcomes, corresponding respectively to a 0 or a 1 having been received, are pre-calculated by adding a different offset to the input signal in two branches of the circuit, and converting each result to a digital value in each of two clocked comparators 305, 310. The correct outcome is selected, in a multiplexer 315, as soon as a decision is made in the receiver regarding whether the previously received bit was a 0 or a 1. A predictive DFE may have one or more predictive taps. Referring to FIG. 4, the pre-calculation may be accomplished using a circuit including a differential amplifier 410, a latch 415, and a current DAC 420, each constructed from field-effect transistors (FETs). The differential amplifier and the latch are clocked by complementary phases of the clock, to form a clocked comparator or "slicer," and the current DAC adds an offset current to the output of the differential amplifier. The current DAC used in this approach consumes additional power, and, because the first tap may be the largest tap in the system, the parasitic capacitance, and the corresponding degradation in circuit speed, imposed by the connection of the current DAC to the slicer may be significant.

Figure 5:
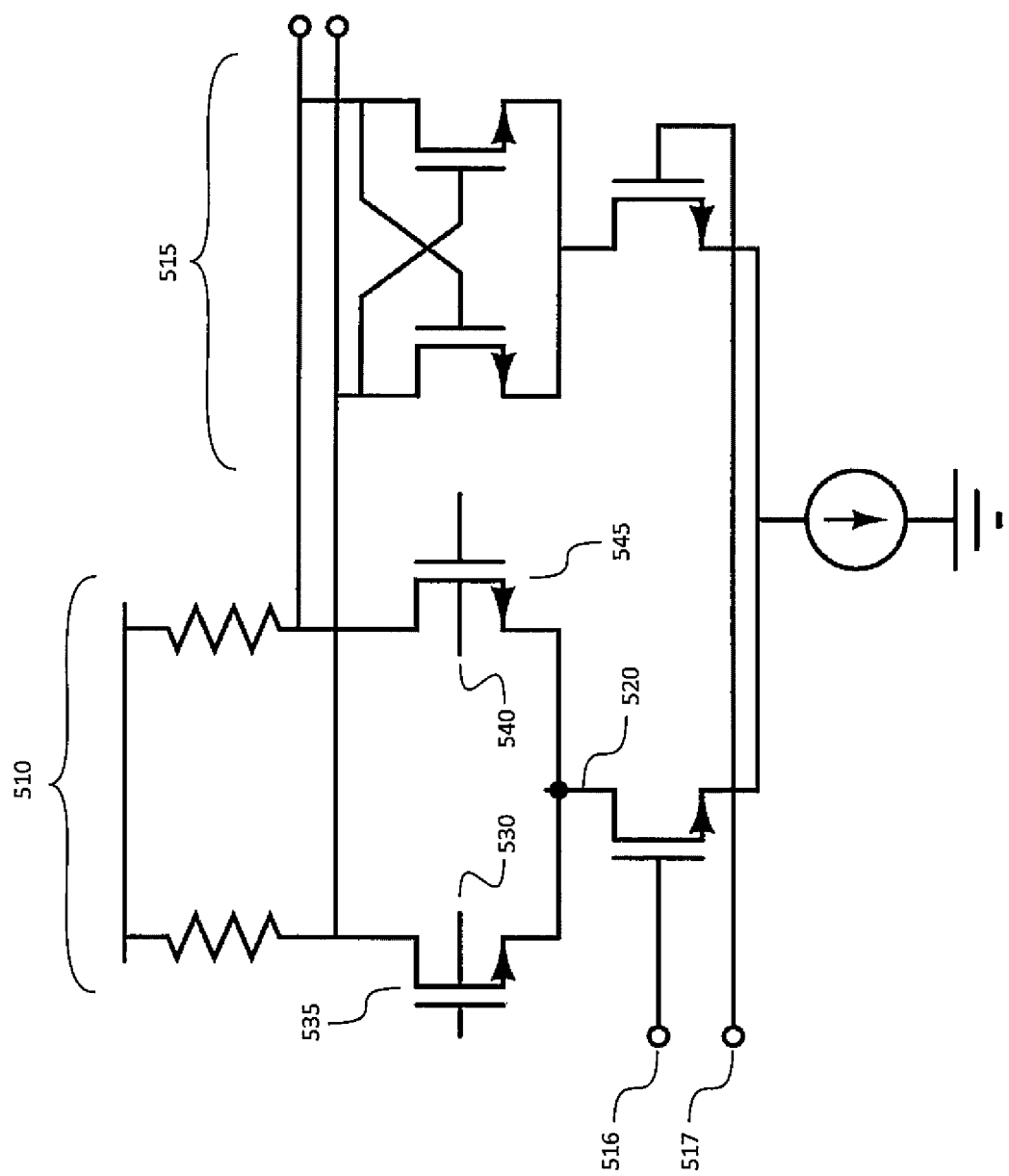
FIG. 5 is a schematic diagram of a slicer with body bias according to an embodiment of the present invention.

Referring to FIG. 5, in one embodiment, a predictive DFE circuit uses the insight that in a predictive DFE circuit, a predictive tap, e.g., the first tap, is not actively switching so it is not necessary to add the correction to a high-speed node. In this embodiment a slicer includes a differential amplifier 510 and a latch 515. The differential amplifier 510 and the latch 515 are clocked by complementary phases of the clock supplied at a first clock input 516 and a second clock input 517. The fourth terminal, or "bulk" terminal, of one or both of the transistors in the differential amplifier 510 of a slicer is used to implement the first tap offset without the first tap being directly in the data path. The differential amplifier 510 includes two FETs 535, 545 connected in a differential pair configuration, with one terminal of each FET connected to a common node, or "tail" 520. The differential amplifier offset is implemented by providing an offset voltage as a bias applied to the fourth terminal of one or more FETs. This bias on the fourth terminal, or "body bias," may be applied in a single ended fashion, applied to one of the FETs of the differential amplifier 510, or it may be applied in a differential fashion to ensure symmetry in the circuit, with a first bias applied to the fourth terminal 530 of the first FET 535 of the differential amplifier 510 and a second, complementary bias applied to the fourth terminal 540 of the second FET 545 of the differential amplifier 510.

Figure 6:
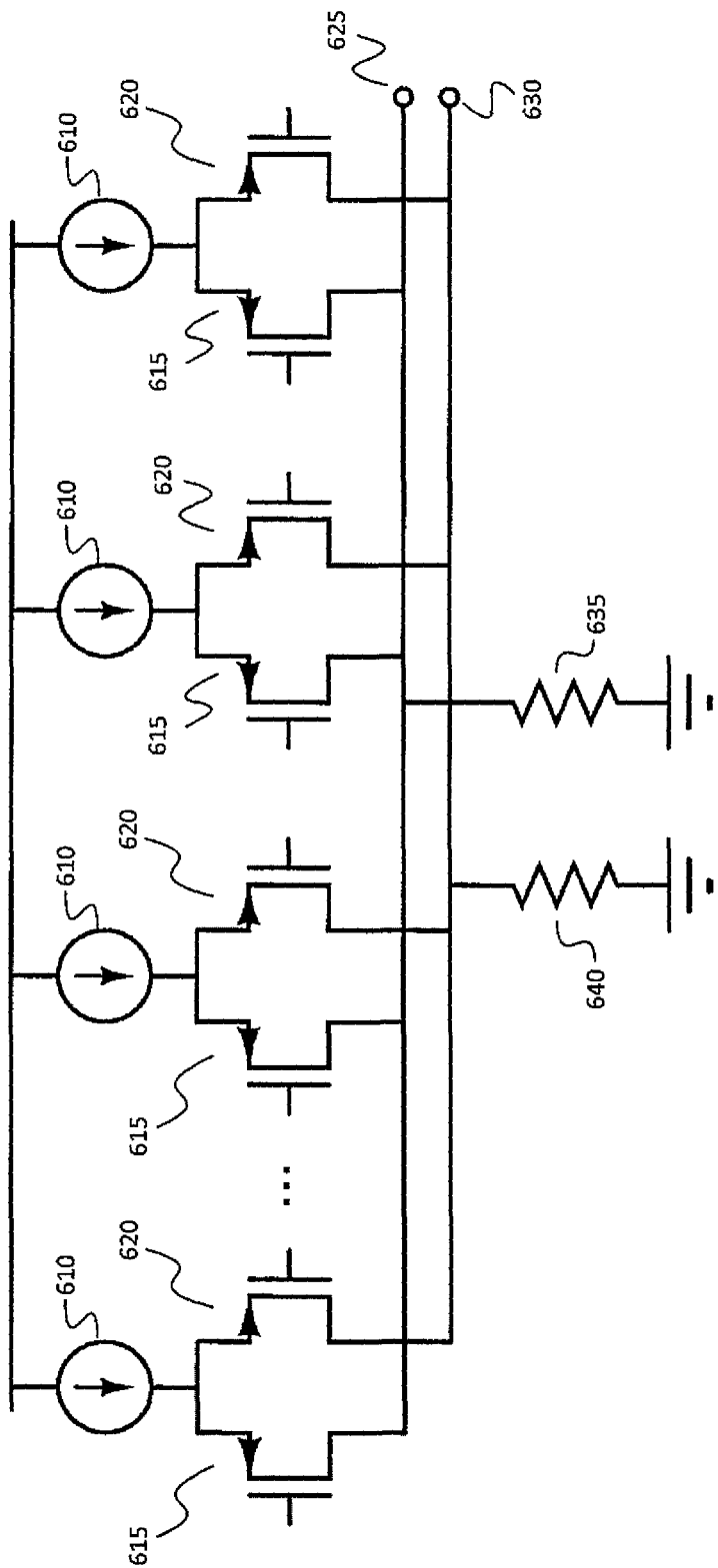
FIG. 6 is a schematic diagram of a voltage-mode DAC for providing body bias according to an embodiment of the present invention.

A differential bias is generated, in one embodiment, by the differential DAC of FIG. 6. In this DAC, each of a set of n current sources 610 provides a current, where n is the number of bits of the DAC. Each current source 610 includes or consists of a FET; the gates of these current source FETs are connected to a DAC current source bias voltage which may be externally supplied, at a bias control input of the DAC. The gate width of each current source FET is equal to twice the gate width of the preceding current source FET in the set, so that the current provided by each current source 610 is equal to twice the current of the preceding current source 610 in the set. The smallest of the current source FETs has a gate width referred to as the unit current source gate width, and it supplies a branch current referred to as the unit branch current. Each current source feeds two branches of the DAC, containing a first DAC switching transistor, e.g., switching FET 615 and a second DAC switching transistor, e.g., switching FET 620, connected to the first DAC output 625 and the second DAC output 630, respectively. The switching FET in each branch may be switched on or off by a respective control signal; these control signals control the output of the DAC. In other embodiments the ratio of currents in consecutive current sources in the series may be different from 2, or the currents supplied by the current sources may not form a geometric progression. The first DAC branches are all connected to a first resistor 635, and the second DAC branches are all connected to a second resistor 640, so that the total currents flowing in each of the first resistor 635 and the second resistor 640 produce respective output voltages at the two complementary DAC outputs 625, 630. In an embodiment using a single-ended DAC, each DAC current source 610 feeds only one branch of the DAC, each branch containing one switching FET, and the branches are connected to a DAC resistor, so that the total current flowing in the branches of the DAC produces a voltage at the DAC output. In one embodiment, a differential DAC is used to provide an offset voltage in one branch of the predictive DFE circuit, and the same differential DAC is used to provide an opposite offset in the other branch of the predictive DFE circuit, by reversing, in the second branch, the connection of the two DAC outputs to the fourth terminals of the FETs in the differential amplifier. In one embodiment the offset voltage supplied as a body bias, instead of being supplied by a DAC, is supplied by another source of offset voltage source, or "offset voltage source", which may be a fixed voltage source.

Figure 7:
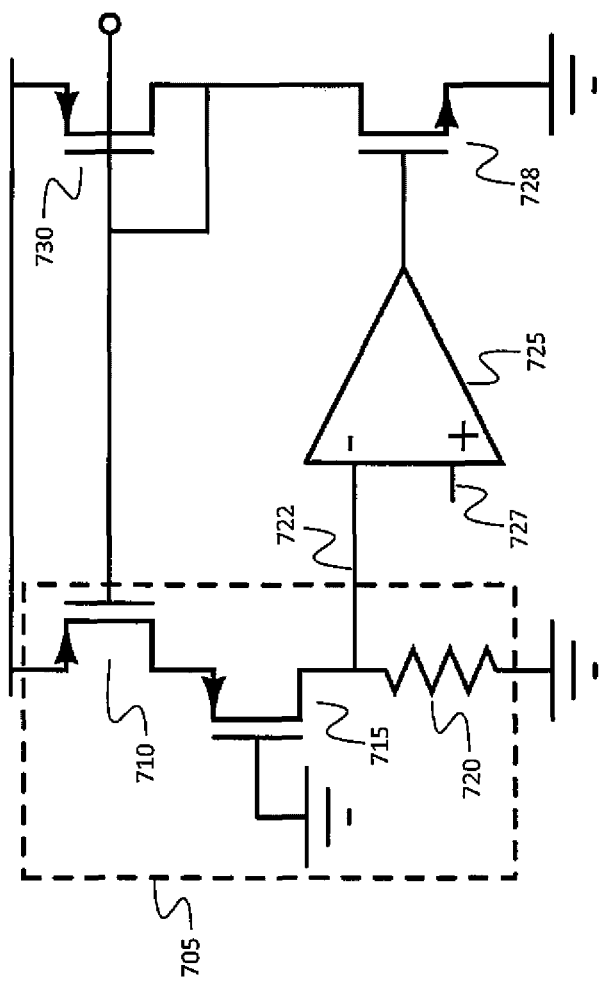
FIG. 7 is a schematic diagram of a circuit for regulating DAC bias according to an embodiment of the present invention.

In one embodiment, it is necessary to avoid forward biasing the bulk of a FET device. This may be accomplished by ensuring, using a circuit for limiting the maximum DAC output voltage, or "DAC voltage limit circuit", that the maximum DAC output voltage is less than the voltage at the tail of the slicer, or at least that the maximum DAC output voltage exceeds the slicer tail voltage by less than a diode drop, so that any leakage current resulting from slight forward-biasing of the bulk is small. The maximum DAC output voltage corresponds to all of the first switching FETs 615 being turned on, or all of the second switching FETs being turned on, resulting in the maximum DAC current (the total current provided by the current sources 610) being driven through one of the DAC resistors 635, 640. FIG. 7 illustrates a DAC voltage limit circuit according to one embodiment. In this circuit current flows to ground through a replica circuit 705 including or consisting of a current source replica FET 710, a switching transistor replica FET 715, and a replica resistor 720, connected in series. The gate of the current source replica FET 710 is connected to the gates of the current source FETs in the DAC (i.e., to the bias control input of the DAC). The gate width of the current source replica FET is $(2n-1)/k$ times the unit current source gate width, and the switching transistor replica FET 715 is turned on, e.g., by grounding of the gate as illustrated. This configuration results in a current flowing through current source replica FET 710, the switching transistor replica FET 715, and through the replica resistor 720, that is equal to $1/k$ times the maximum DAC current, where k is a replica scaling factor. The replica resistor 720 has a resistance equal to k times the resistance of either of the DAC resistors 635, 640 so that the voltage at the replica voltage output 722, i.e., the voltage drop across the replica resistor 720, is equal to the maximum output voltage of the DAC. The resistor is connected to the inverting input of an operational amplifier (op-amp) 725 configured as a feedback amplifier of a negative feedback loop for controlling the DAC current source control voltage. The non-inverting input 727 of the feedback amplifier 725 operates as a reference voltage input, and is connected to the slicer tail 520 (FIG. 5). The feedback amplifier 725 drives the gate of a current control FET 728, which controls the current through a diode connected reference FET 730. The reference FET 730 is the reference device of a current mirror that includes the current source replica FET 710 and the current source FETs in the DAC as mirroring devices.

If the maximum DAC output voltage, present in the replica circuit as the voltage at the inverting input of the feedback amplifier 725, begins to exceed the slicer tail voltage, the output of the feedback amplifier will decrease, reducing the current flowing through the current control FET 728. This results in a reduction in the current flowing through the reference FET 730, and, consequently, a reduction in the currents flowing through the DAC current source FETs and the current source replica FET 710; in this manner feedback through the feedback amplifier 725 corrects any increase of the maximum DAC output voltage beyond the slicer tail voltage.

In operation, a system controller may set the DAC output either to a value determined prior to operation based on a measurement or a simulation of the behavior of the non-ideal (e.g., lossy) channel, or the system controller may set the DAC channel empirically during operation, adjusting the setting (and the settings of other DACs in the DFE) until the performance of the DFE is acceptable or optimized. The performance of the DFE may be measured, for example, based on the bit error rate, if error detection code is used on the transmitted data. A gradient descent process may be used to find a minimum or acceptable bit error rate.

The voltage at the slicer tail 520 may fluctuate as a result of its being connected to ground by a transistor controlled by a clock or switching of the input differential pair. These fluctuations may be sufficiently above the bandwidth of the control loop implemented by the feedback amplifier 725 to have little effect, or they may be suppressed by coupling the complementary clock signal to the slicer tail with a capacitor selected to cancel the high frequency fluctuations present in the slicer tail voltage.

The gain and bandwidth of the control loop implemented by the feedback amplifier 725 is influenced by several factors, including the gain and bandwidth of the feedback amplifier 725 and the value of the replica resistor. In one embodiment the unity gain frequency of this loop is selected to be between 100 kHz and 10 MHz, being high enough to provide rapid start-up, but not sufficiently high to compromise loop stability.

Figure 8:
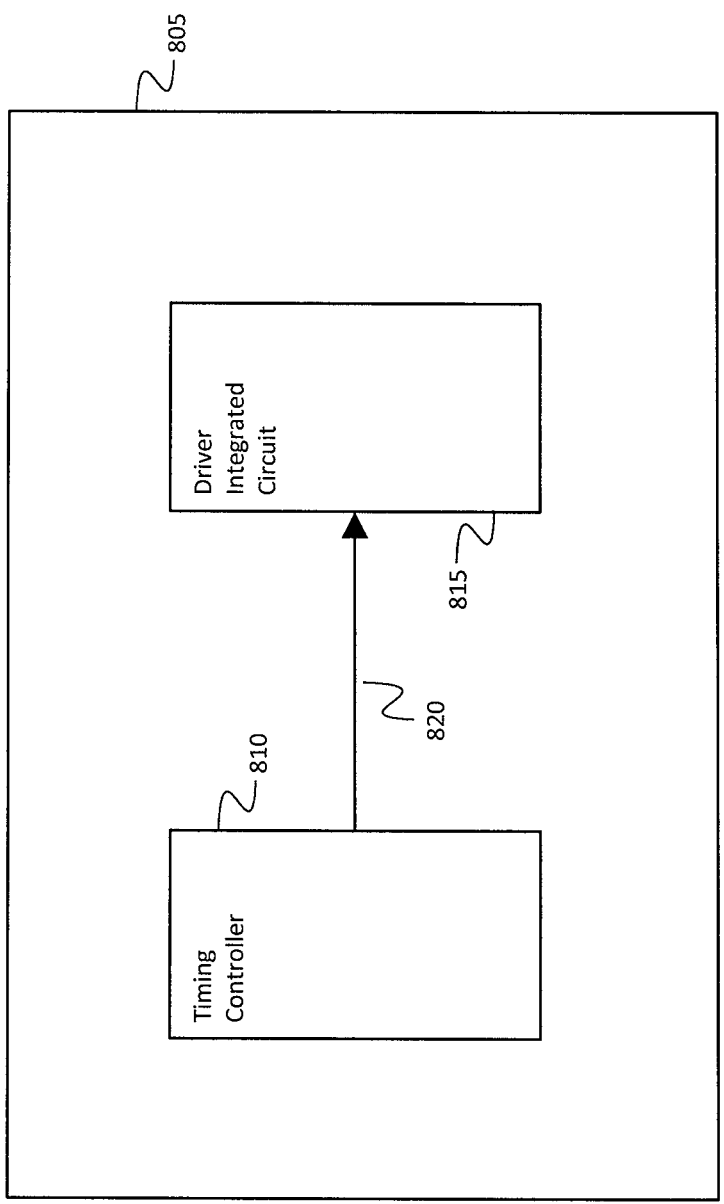
FIG. 8 is a block diagram of a display employing predictive decision feedback equalization using body bias according to an embodiment of the present invention.

Referring to FIG. 8, in one embodiment a display 805 contains a timing controller 810 configured to send high-speed digital data to a driver integrated circuit (driver IC) 815, over a non-ideal (e.g., lossy) channel 820. The driver IC receives a signal that is affected by inter-symbol interference, and includes a receiver constructed according to an embodiment of the present invention to mitigate the effects of the inter-symbol interference.

Although exemplary embodiments of a body-biased slicer design for predictive decision feedback equalizers have been specifically described and illustrated herein, many modifications and variations will be apparent to those skilled in the art. For example, although in the circuits described and illustrated, n-channel FETS are used in the slicer and p-channel FETs are used in the voltage-mode DAC, complementary circuits using p-channel FETs in the slicer or n-channel FETs in the voltage-mode DAC could be employed. Accordingly, it is to be understood that a body-biased slicer design for predictive decision feedback equalizers constructed according to principles of this invention may be embodied other than as specifically described herein. The invention is also defined in the following claims, and equivalents thereof.

What is claimed is:

1. A receiver with predictive decision feedback equalization, the receiver comprising:
a first differential amplifier comprising a first field effect transistor (FET) and a second FET, the first FET and the second FET being connected in a differential pair configuration;
a voltage-mode digital to analog converter (DAC) comprising a first DAC output, the first DAC output being connected to a bulk terminal of the first FET; and
a DAC voltage limit circuit connected to the DAC,
the DAC voltage limit circuit comprising:
a replica circuit to generate a replica voltage equal to a maximum DAC output voltage of the DAC, and
a feedback amplifier to generate a control voltage to control the maximum DAC output voltage, the control voltage being proportional to the difference between the replica voltage and a voltage at a tail of the differential pair configuration.

2. A receiver with predictive decision feedback equalization, the receiver comprising:
a first differential amplifier comprising a first field effect transistor (FET) and a second FET, the first FET and the second FET being connected in a differential pair configuration;
a voltage-mode digital to analog converter (DAC) comprising a first DAC output, the first DAC output being connected to a bulk terminal of the first FET; and
a DAC voltage limit circuit connected to the DAC,
wherein the DAC comprises:
a DAC resistor,
a plurality of branches, and
a bias control input;
and wherein the DAC voltage limit circuit comprises:
a reference voltage input connected to a common node of the first differential amplifier, and
a replica circuit having a replica voltage output, the replica circuit comprising a scaled replica of a branch of the plurality of branches of the DAC.

3. The receiver of claim 2, wherein each of the plurality of branches of the DAC comprises a branch current source.

4. The receiver of claim 3 wherein the branch current source of a first branch of the DAC comprises a FET having a first gate width, the gate of the FET connected to the bias control input of the DAC, and the branch current sources of a remainder of the branches of the plurality of branches of the DAC comprise FETs having gate widths of increasing powers of 2 times the first gate width.

5. The receiver of claim 3, wherein the replica circuit comprises a current source replica FET, a switching transistor replica FET, and a replica resistor, connected in series.

6. The receiver of claim 5, wherein:
each of the branch current sources of the plurality of branches of the DAC comprises a FET, each FET having a gate width;
the resistance of the replica resistor is k times the resistance of the DAC resistor, where k is a replica scaling factor; and
the gate width of the current source replica FET is the sum of the gate widths of the gate widths of the branch current sources of the plurality of branches of the DAC.

7. The receiver of claim 5, wherein:
the DAC voltage limit circuit comprises a feedback amplifier having a first input and a second input, the first input being connected to the replica voltage output and the second input being connected to the reference voltage input.

8. The receiver of claim 7, wherein the feedback amplifier is configured to maintain a voltage at the first input that is substantially the same as that at the second input.

9. The receiver of claim 8, wherein the feedback amplifier comprises an output, and the output is connected to a gate of a first bias control FET, the first bias control FET being connected in series with a second bias control FET, the second bias control FET being diode-connected.

10. The receiver of claim 9, wherein the second bias control FET is configured to operate as a reference device in a current mirror, the current source replica FET and the FETs of the branch current sources of the DAC being mirror devices in the current mirror.

11. The receiver of claim 10, wherein:
the first FET and the second FET of the first differential amplifier are n-channel FETs;
the source of the first FET is connected to the common node of the first differential amplifier; and
the source of the second FET is connected to the common node of the first differential amplifier.

12. The receiver of claim 2, wherein the DAC is a differential DAC comprising the first DAC output and a second DAC output, the second DAC output being connected to a bulk terminal of the second FET.

13. The receiver of claim 12, wherein each of the plurality of branches of the DAC comprises a branch current source.

14. The receiver of claim 13 wherein the branch current source of a first branch of the DAC comprises a FET having a first gate width, the gate of the FET connected to the bias control input of the DAC, and the branch current sources of a remainder of the branches of the plurality of branches of the DAC comprise FETs having gate widths of increasing powers of 2 times the first gate width.

15. The receiver of claim 13, wherein the replica circuit comprises a current source replica FET, a switching transistor replica FET, and a replica resistor, connected in series.

16. The receiver of claim 15, wherein:
each of the branch current sources of the plurality of branches of the DAC comprises a FET, each FET having a gate width;
the resistance of the replica resistor is k times the resistance of the DAC resistor, where k is a replica scaling factor; and
the gate width of the current source replica FET is the sum of the gate widths of the gate widths of the branch current sources of the plurality of branches of the DAC.

17. The receiver of claim 15, wherein:
the DAC voltage limit circuit comprises a feedback amplifier having a first input and a second input, the first input being connected to the replica voltage output and the second input being connected to the reference voltage input.

18. The receiver of claim 17, wherein the feedback amplifier comprises an amplifier output, and the amplifier output is connected to a gate of a first bias control FET, the first bias control FET being connected in series with a second bias control FET, the second bias control FET being diode-connected.

19. The receiver of claim 12, further comprising a second differential amplifier comprising a first FET and a second FET, the first FET and the second FET of the second differential amplifier being connected in a differential pair configuration.

20. The receiver of claim 19, wherein the first DAC output is connected to a bulk terminal of the second FET of the second differential amplifier and the second DAC output is connected to a bulk terminal of the first FET of the second differential amplifier.

21. A display, comprising:
a timing controller comprising a digital output; and
a driver integrated circuit (IC) comprising:
an IC input; and
the receiver of claim 1,
a receiver input, of the receiver, being connected to the IC input,
the digital output of the timing controller being connected to the IC input of the driver IC.

* * * * *